US010832618B2

(12) United States Patent
Gao et al.

(10) Patent No.: US 10,832,618 B2
(45) Date of Patent: Nov. 10, 2020

(54) CIRCUITS AND METHODS FOR REDUCING ILLUMINATION UNEVENNESS AND IMPROVING APERTURE RATIOS IN DISPLAY DEVICES

(71) Applicant: BOE TECHNOLOGY GROUP CO., LTD., Beijing (CN)

(72) Inventors: Xueling Gao, Beijing (CN); Chengchung Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/151,665

(22) Filed: Oct. 4, 2018

(65) Prior Publication Data

US 2019/0213957 A1 Jul. 11, 2019

(30) Foreign Application Priority Data

Jan. 5, 2018 (CN) .......................... 2018 1 0011594

(51) Int. Cl.
*G09G 3/3291* (2016.01)
*G09G 3/3258* (2016.01)
(Continued)

(52) U.S. Cl.
CPC ......... *G09G 3/3291* (2013.01); *G09G 3/3233* (2013.01); *G09G 3/3258* (2013.01); *G09G 3/3266* (2013.01); *G09G 3/3283* (2013.01); *G09G 2300/043* (2013.01); *G09G 2300/0426* (2013.01); *G09G 2300/0439* (2013.01); *G09G 2300/0819* (2013.01); *G09G 2300/0852* (2013.01); *G09G 2300/0861* (2013.01);
(Continued)

(58) Field of Classification Search
CPC .. G09G 3/3233; G09G 3/3258; G09G 3/3266; G09G 3/3283; G09G 3/3291; G09G 2300/0426; G09G 2300/043; G09G 2300/0439; G09G 2300/0819; G09G 2300/852; G09G 2300/0861; G09G 2320/0233; G09G 2320/045
See application file for complete search history.

(56) References Cited

U.S. PATENT DOCUMENTS 9,514,674 B2 * 12/2016 Kumeta ............... G09G 3/3225
10,127,859 B2 * 11/2018 Chang .................. G09G 3/3233
(Continued)

FOREIGN PATENT DOCUMENTS

CN 1713253 A 12/2005
CN 101329836 A 12/2008
(Continued)

OTHER PUBLICATIONS

First Office Action for CN Application No. 201810011594.4, dated May 22, 2019.
(Continued)

*Primary Examiner* — Kwang-Su Yang
(74) *Attorney, Agent, or Firm* — Dinsmore & Shohl LLP

(57) ABSTRACT

The present disclosure relates to a pixel circuit and a method of driving the pixel circuit, and a display device. A pixel circuit, including: a light emitting device; a driving circuit; a data writing circuit; a light emitting control circuit; a threshold compensation circuit; a first storage circuit; and a second storage circuit.

15 Claims, 5 Drawing Sheets

(51) Int. Cl.
*G09G 3/3266* (2016.01)
*G09G 3/3283* (2016.01)
*G09G 3/3233* (2016.01)

(52) U.S. Cl.
CPC ............... *G09G 2320/0233* (2013.01); *G09G 2320/045* (2013.01)

(56) References Cited

U.S. PATENT DOCUMENTS

| | | | | |
|---|---|---|---|---|
| 10,163,394 | B2 * | 12/2018 | Li | G09G 3/3258 |
| 2004/0145547 | A1 | 7/2004 | Oh | |
| 2005/0052377 | A1 | 3/2005 | Hsueh | |
| 2007/0164959 | A1 * | 7/2007 | Childs | G09G 3/3233 345/92 |
| 2011/0227903 | A1 * | 9/2011 | Choi | G09G 3/3233 345/212 |
| 2012/0019498 | A1 | 1/2012 | Jeong | |
| 2018/0301092 | A1 * | 10/2018 | Ma | G09G 3/3233 |
| 2019/0019453 | A1 * | 1/2019 | Chen | H01L 27/3276 |

FOREIGN PATENT DOCUMENTS

| | | | |
|---|---|---|---|
| CN | 104183215 | A | 12/2014 |
| CN | 104751799 | A | 7/2015 |
| CN | 106952617 | A | 7/2017 |
| CN | 107068060 | A | 8/2017 |
| CN | 107146579 | A | 9/2017 |
| JP | 2003-108067 | A | 4/2003 |
| JP | 2010-224390 | A | 10/2010 |

OTHER PUBLICATIONS

Second Office Action for CN Appl. No. 201810011594.4, dated Jan. 13, 2020.

* cited by examiner

CIRCUITS AND METHODS FOR REDUCING ILLUMINATION UNEVENNESS AND IMPROVING APERTURE RATIOS IN DISPLAY DEVICES

CROSS REFERENCE TO RELATED APPLICATIONS

The present application claims priority to Chinese Patent Application No. 201810011594.4, filed on Jan. 5, 2018, the disclosure of which is hereby incorporated by reference in its entirety.

FIELD

The present disclosure relates to the field of display panels, and in particular, to a pixel circuit, a method of driving the pixel circuit, and a display device.

BACKGROUND

The Active Matrix Organic Light Emitting Diode (AMOLED) display panel uses OLEDs to emit light of different brightness, so that pixels corresponding to the OLEDs have corresponding brightness. Compared with the conventional Thin Film Transistor Liquid Crystal Display (TFT LCD) panel, AMOLED display panel has a faster reaction speed, higher contrast and a wider viewing angle, which is an important development direction of display panels.

SUMMARY

According to one aspect of the present disclosure, there is provided a pixel circuit, including: a light emitting device; a driving circuit, electrically connected to the light emitting device, and configured to drive the light emitting device to emit light; a data writing circuit, electrically connected to a first scan signal input terminal, a data signal input terminal and a control terminal of the driving circuit respectively, and configured to, according to a first scan signal inputted from the first scan signal input terminal, control the data signal input terminal to input a data voltage to the control terminal of the driving circuit; a light emitting control circuit, electrically connected to a light emitting input terminal, a first voltage input terminal and a first terminal of the driving circuit respectively, and configured to, according to a light emitting signal inputted from the light emitting signal input terminal, control the first voltage input terminal to input a first voltage to the first terminal of the driving circuit; a threshold compensation circuit, electrically connected to a second scan signal input terminal, the control terminal of the driving circuit and a second terminal of the driving circuit, and configured to, according to a second scan signal inputted from the second scan signal input terminal, control the conduction or disconnection between the control terminal of the driving circuit and the second terminal of the driving circuit; a first storage circuit, electrically connected to a second voltage input terminal and the first terminal of the driving circuit respectively, and configured to store a voltage difference between a second voltage of the second voltage input terminal and the first terminal of the driving circuit; and a second storage circuit, electrically connected to the first terminal of the driving circuit and the control terminal of the driving circuit respectively, and configured to store a voltage difference between the first terminal of the driving circuit and the control terminal of the driving circuit.

In some embodiments according to the present disclosure, the data writing circuit includes a first transistor, a control electrode of the first transistor is electrically connected to the first scan signal input terminal, a first electrode of the first transistor is electrically connected to the data signal input terminal, and a second electrode of the first transistor is electrically connected to the control terminal of the driving circuit.

In some embodiments according to the present disclosure, the light emitting control circuit includes a second transistor, a control electrode of the second transistor is electrically connected to the light emitting signal input terminal, a first electrode of the second transistor is electrically connected to the first voltage input terminal, and a second electrode of the second transistor is electrically connected to the first terminal of the driving circuit.

In some embodiments according to the present disclosure, the first transistor and the second transistor are of opposite types, the first scan signal input terminal shares a first signal line with the light emitting signal input terminal.

In some embodiments according to the present disclosure, the threshold compensation circuit includes a third transistor, a control electrode of the third transistor is electrically connected to the second scan signal input terminal, a first electrode of the third transistor is electrically connected to the control terminal of the driving circuit, and a second electrode of the third transistor is electrically connected to the second terminal of the driving circuit.

In some embodiments according to the present disclosure, the first storage circuit includes a first capacitor, a first terminal of the first capacitor is electrically connected to the second voltage input terminal, and a second terminal of the first capacitor is electrically connected to the first terminal of the driving circuit.

In some embodiments according to the present disclosure, the second storage circuit includes a second capacitor, a first terminal of the second capacitor is electrically connected to the first terminal of the driving circuit, and a second terminal of the second capacitor is electrically connected to the control terminal of the driving circuit.

In some embodiments according to the present disclosure, the driving circuit includes a driving transistor, a control electrode of the driving transistor is electrically connected to the data writing circuit, the second storage circuit and the threshold compensation circuit respectively, a first electrode of the driving transistor is electrically connected to the light emitting control circuit, the first storage circuit and the second storage circuit respectively, and a second electrode of the driving transistor is electrically connected to the threshold compensation circuit and the light emitting device respectively.

In some embodiments according to the present disclosure, the first voltage input terminal shares a second signal line with the second voltage input terminal.

According to another aspect of the present disclosure, there is provided a display device, including the above pixel circuit of the present disclosure.

According to a further aspect of the present disclosure, there is provided a method of driving the pixel circuit of the present disclosure, including: in an initialization stage, inputting a first scan signal to the first scan signal input terminal to turn on the data writing circuit, inputting a second scan signal to the second scan signal input terminal to turn on the threshold compensation circuit, and inputting an initial data voltage to the data signal input terminal, such that the initial data voltage is written to the control terminal of the driving circuit, and a threshold voltage of the driving circuit is written to the first terminal of the driving circuit; in a data writing stage, inputting the first scan signal to the first scan signal input terminal to turn on the data writing circuit, and inputting a working data voltage to the data signal input terminal, such that the working data voltage is written to the control terminal of the driving circuit and the first terminal of the driving circuit; and in a light emitting stage, inputting a light emitting signal to the light emitting signal input terminal to turn on the light emitting control circuit, inputting a first voltage to the first voltage input terminal, such that the first voltage is written to the first terminal of the driving circuit, and inputting a second voltage to the second voltage input terminal, such that the driving circuit drives the light emitting device to emit light.

In some embodiments according to the present disclosure, the data writing circuit includes a first transistor, the light emitting control circuit includes a second transistor, the threshold compensation circuit includes a third transistor, the driving circuit includes a driving transistor, and the first transistor, the second transistor, the third transistor and the driving transistor are all P-type transistors, in the initialization stage, the first scan signal is a low level signal, the second scan signal is a low level signal, and the light emitting signal is a high level signal; in the data writing stage, the first scan signal is a low level signal, the second scan signal is a high level signal, and the light emitting signal is a high level signal; in the light emitting stage, the first scan signal is a high level signal, the second scan signal is a high level signal, and the light emitting signal is a low level signal.

In some embodiments according to the present disclosure, the data writing circuit includes a first transistor, the light emitting control circuit includes a second transistor, the threshold compensation circuit includes a third transistor, the driving circuit includes a driving transistor, the first transistor, the third transistor and the driving transistor are all P-type transistors, and the second transistor is a N-type transistor, in the initialization stage, the first scan signal is a low level signal, the second scan signal is a low level signal, and the light emitting signal is a low level signal; in the data writing stage, the first scan signal is a low level signal, the second scan signal is a high level signal, and the light emitting signal is a low level signal; and in the light emitting stage, the first scan signal is a high level signal, the second scan signal is a high level signal, and the light emitting signal is a high level signal.

In some embodiments according to the present disclosure, initial data voltage is less than a cathode voltage of the light emitting device.

In some embodiments according to the present disclosure, the data writing circuit includes a first transistor, the light emitting control circuit includes a second transistor, the first transistor and the second transistor are of opposite types, and the first scan signal is identical with the light emitting signal.

In some embodiments according to the present disclosure, the data writing circuit includes a first transistor, the light emitting control circuit includes a second transistor, the threshold compensation circuit includes a third transistor, the driving circuit includes a driving transistor, and the first voltage is identical with the second voltage.

BRIEF DESCRIPTION OF THE DRAWINGS

In order to more clearly explain the technical solution of the present disclosure, a brief introduction will be given below for the drawings required to be used in the description of the embodiments of the present disclosure. It is obvious that, the drawings illustrated as follows are merely some of the embodiments of the present disclosure. For a person skilled in the art, he or she may also acquire other drawings according to such drawings on the premise that no inventive effort is involved.

DETAILED DESCRIPTIONS

In order to make the above objects, features, and advantages of the present disclosure more comprehensible, the present disclosure will be further described in detail with reference to the accompanying drawings and specific embodiments.

The current that drives an OLED device to emit light can be expressed by the following formula:

$$I_{OLED} = \frac{\beta}{2}(Vgs - Vth)^2.$$

Vgs is a voltage difference between a gate electrode and a source electrode of a driving transistor, β is a parameter related to the process parameters and feature size of the driving transistor, and Vth is a threshold voltage of the driving transistor.

According to the above formula, the driving current for driving the light emitting device OLED to emit light is related to the threshold voltage Vth of the driving transistor. In practical applications, however, the threshold voltage Vth of the driving transistor may drift during the light emitting stage, thereby affecting the light emitting brightness of the light emitting device OLED and resulting in uneven brightness during the light emitting process, which may adversely affect the display effect of the OLED display panel.

Figure 1:
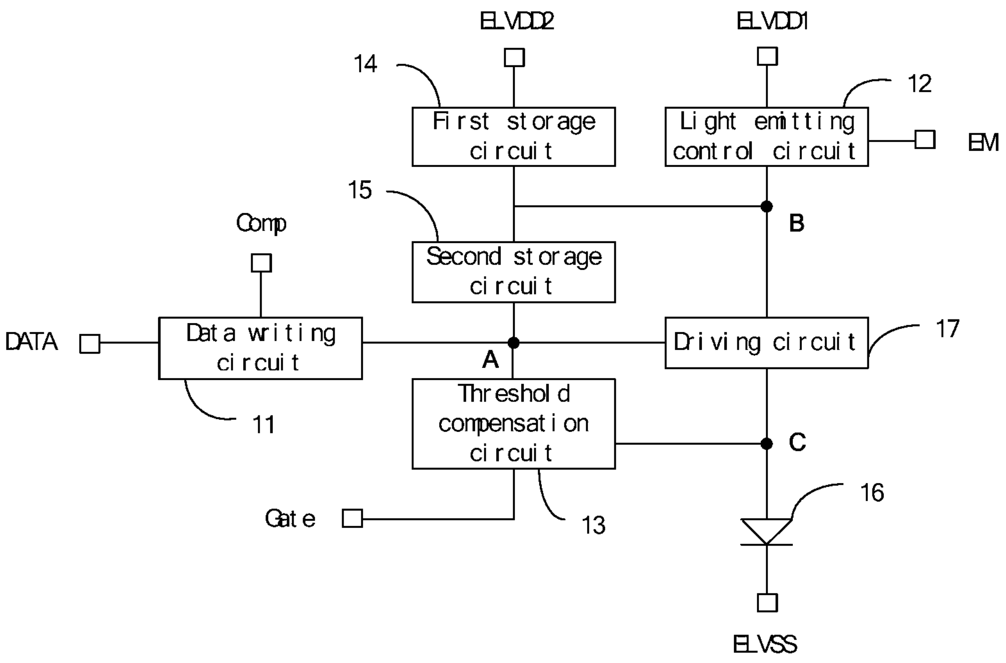
FIG. 1 is a structural block diagram of a pixel circuit according to an embodiment of the present disclosure.

An embodiment of the present disclosure provides a pixel circuit. Referring to FIG. 1, the pixel circuit may include: a data writing circuit 11, a light emitting control circuit 12, a threshold compensation circuit 13, a first storage circuit 14, a second storage circuit 15, a driving circuit 17 and a light emitting device 16. The data writing circuit 11 is electrically connected to a first scan signal input terminal Comp, a data signal input terminal DATA and a control terminal A of the driving circuit 17 respectively, and configured to control the data signal input terminal DATA to input a data voltage to the control terminal A of the driving circuit 17 based on a first scan signal inputted from the first scan signal input terminal Comp. The light emitting control circuit 12 is electrically connected to the light emitting signal input terminal EM, the first voltage input terminal ELVDD1 and the first terminal B of the driving circuit 17 respectively, and configured to control the first voltage input terminal ELVDD1 to provide a first voltage to the first terminal B of the driving circuit 17 according to a light emitting signal inputted from the light emitting signal input terminal EM. The threshold compensation circuit 13 is electrically connected to the second scan signal input terminal Gate, the control terminal A of the driving circuit 17 and the second terminal C of the driving circuit 17 respectively, and configured to control the ON or OFF of the conduction between the control terminal A of the driving circuit 17 and the second terminal C of the driving circuit 17 according to a second scan signal inputted from the second scan signal input terminal Gate. The first storage circuit 14 is electrically connected to the second voltage input terminal ELVDD2 and the first terminal B of the driving circuit 17 respectively, and configured to store a voltage difference between the second voltage input terminal ELVDD2 and the first terminal B of the driving circuit 17. The second storage circuit 15 is electrically connected to the first terminal B of the driving circuit 17 and the control terminal A of the driving circuit 17 respectively, and configured to store a voltage difference between the first terminal B of the driving circuit 17 and the control terminal A of the driving circuit 17. The second terminal C of the driving circuit 17 is further electrically connected to the light emitting device 16, and configured to drive the light emitting device 16 to emit light. The second terminal C of the driving circuit 17 can be electrically connected to the anode of the light emitting device 16.

According to the pixel circuit provided by an embodiment of the present disclosure, when a light emitting device such as a OLED pixel is driven to emit light, in an initialization stage, the first scan signal input terminal Comp inputs a first scan signal to the data writing circuit 11, so that the data writing circuit 11 is turned on, and the data signal input terminal DATA inputs an initial data voltage Vint to the control terminal A of the driving circuit. The second scan signal input terminal Gate inputs a second scan signal to the threshold compensation circuit 13, so that the threshold compensation circuit 13 is turned on, the conduction between the control terminal A of the driving circuit 17 and the second terminal C of the driving circuit 17 is established, thereby the anode of the light emitting device 16 has the same voltage Vint as the control terminal A of the driving circuit. Vint may be set to be less than a cathode voltage ELVSS of the light emitting device 16, so as to ensure that the light emitting device 16 does not emit light during the initialization stage. In this process, with the light emitting signal inputted from the light emitting signal input terminal EM, the first voltage input terminal ELVDD1 can be controlled to be disconnected from the first terminal B of the driving circuit. The driving circuit 17 is turned on according to the voltage of the control terminal A of the driving circuit 17, the voltage of the first terminal B of the driving circuit 17 and its threshold voltage. At the same time, the voltage of the first terminal B of the driving circuit begins to decrease from the first voltage V1 of the light emitting stage of a previous period, until the voltage of the first terminal B of the driving circuit 17 drops down to Vint−Vth where the driving circuit 17 is turned off. Vth is the threshold voltage of the driving circuit 17.

In the data writing stage, the first scan signal input terminal Comp inputs a first scan signal to the data writing circuit 11, so that the data writing circuit 11 is turned on and the data signal input terminal DATA inputs a working data voltage Vdata to the control terminal A of the driving circuit 17. In this stage, the driving circuit 17, the threshold compensation circuit 13 and the light emitting control circuit 12 may be in an OFF state. In the case where the first storage circuit 14 has a capacitor C1 and the second storage circuit 15 has a capacitor C2, since the voltage of the control terminal A of the driving circuit 17 is changed from Vint of the initialization stage to Vdata, the voltage change amount is ΔVA=Vdata−Vint, this voltage change is coupled to the first terminal B of the driving circuit 17 through the capacitors C1 and C2. As a result, a voltage change amount of the first terminal B of the driving circuit 17 is: ΔVB=C2/(C2+C1)*(Vdata−Vint). Thus the voltage of the first terminal B of the driving circuit 17 in this stage is changed from Vint−Vth of the initialization stage to: Vint−Vth+C2/(C2+C1)*(Vdata−Vint), and data writing is completed.

In the light emitting stage, the light emitting signal input terminal EM inputs a light emitting signal to the light emitting control circuit 12, so that the light emitting control circuit 12 is turned on, and the first voltage input terminal ELVDD1 inputs a first voltage V1 to the first terminal B of the driving circuit 17. In this stage, the threshold compensation circuit 13, the data writing circuit 11 may be in OFF state. The voltage of the first terminal B of the driving circuit 17 is changed from Vint−Vth+C2/(C2+C1)*(Vdata−Vint) at the data writing stage to V1, the voltage change amount is ΔVB=V1−(Vint−Vth+C2/(C2+C1)*(Vdata−Vint)). With the capacitance bootstrap effect of the second storage circuit 15, the voltage change amount of the control terminal A of the driving circuit 17 is ΔVA=ΔVB=V1−(Vint−Vth+C2/(C2+C1)*(Vdata−Vint)), so that the voltage of point A in this stage is changed from Vdata at the data writing stage to: Vdata+(V1−(Vint−Vth+C2/(C2+C1)*(Vdata−Vint))). The driving circuit 17 generates a driving current according to the voltage of the control terminal A of the driving circuit 17, the voltage of the first terminal B of the driving circuit 17 and the threshold voltage of the driving circuit 17 to drive the light emitting device 16 to emit light. The driving current can be expressed by the following formula:

$$
\begin{aligned}
I_{OLED} &= \frac{\beta}{2}(Vgs - Vth)^2 \\
&= \frac{\beta}{2}\left(Vdata + \left(V1 - \left(\begin{matrix} V\text{int} - Vth + \\ \frac{C2}{C2 + C1} \times (Vdata - V\text{int}) \end{matrix}\right)\right) - V1 - Vth\right)^2 \\
&= \frac{\beta}{2}\left(\left(1 - \frac{C2}{C2 + C1}\right) \times (Vdata - V\text{int})\right)^2
\end{aligned}
$$

It can be known from the above formula that the driving current for driving the light emitting device 16 to emit light is independent of the threshold voltage of the driving circuit 17, so that image unevenness caused by threshold voltage drift can be eliminated, and the brightness of the light emitting device 16 may remain stable. Moreover, the driving current is independent of the voltage inputted by the first voltage input terminal ELVDD1 or the second voltage input terminal ELVDD2, so that the problem of uneven pixel illumination caused by IR Drop can be eliminated, and the uniformity of pixel brightness may be further improved. In practical applications, the first voltage input terminal ELVDD1 and the second voltage input terminal ELVDD2 can share the same signal line, that is, they can be connected to a common voltage input terminal ELVDD, thereby saving the signal line and increasing the aperture ratio.

Figure 2:
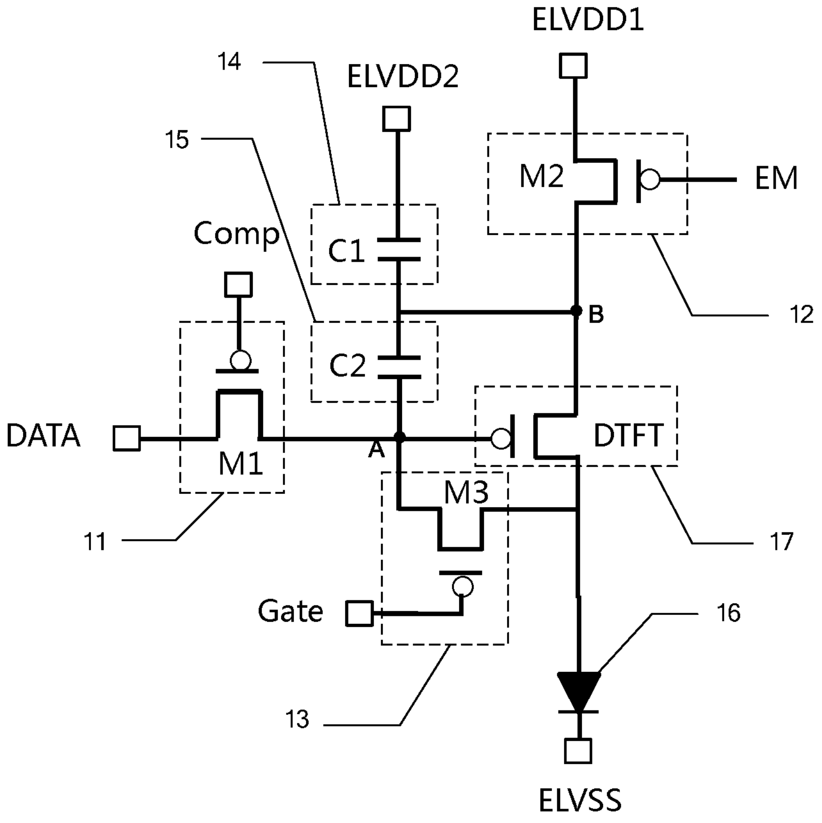
FIG. 2 is a schematic structural diagram of the pixel circuit according to an embodiment of the present disclosure.

Specifically, referring to FIG. 2, the data writing circuit 11 may include a first transistor M1. A control electrode of the first transistor M1 is electrically connected to the first scan signal input terminal Comp, a first electrode of the first transistor M1 is electrically connected to the data signal input terminal DATA, and a second electrode of the first transistor M1 is electrically connected to the control terminal A of the driving circuit 17.

The light emitting control circuit 12 may include a second transistor M2. A control electrode of the second transistor M2 is electrically connected to the light emitting signal input terminal EM, a first electrode of the second transistor M2 is electrically connected to the first voltage input terminal ELVDD1, and a second electrode of the second transistor M2 is electrically connected to the first terminal B of the driving circuit 17.

The threshold compensation circuit 13 may include a third transistor M3. A control electrode of the third transistor M3 is electrically connected to the second scan signal input terminal Gate, a first electrode of the third transistor M3 is electrically connected to the control terminal A of the driving circuit 17, and a second electrode of the third transistor M3 is electrically connected to the second terminal C of the driving circuit 17.

The first storage circuit 14 may include a first capacitor C1, a first terminal of the first capacitor C1 is electrically connected to the second voltage input terminal ELVDD2, and a second terminal of the first capacitor C1 is electrically connected to the first terminal B of the driving circuit 17.

The second storage circuit 15 may include a second capacitor C2, a first terminal of the second capacitor C2 is electrically connected to the first terminal B of the driving circuit 17, and a second terminal of the second capacitor C2 is electrically connected to the control terminal A of the driving circuit 17.

The driving circuit 17 may include a driving transistor DTFT, a control electrode of the driving transistor DTFT is electrically connected to the data writing circuit 11, the second storage circuit 14 and the threshold compensation circuit 13 respectively. A first electrode of the driving transistor DTFT is electrically connected to the light emitting control circuit 12, the first storage circuit 14, and the second storage circuit 15 respectively, and a second electrode of the driving transistor DTFT is electrically connected to the threshold compensation circuit 13 and the light emitting device 16.

In the present embodiment, the "control electrode" of each of the above transistors may be a gate electrode, the "first electrode" may be a source electrode, and the "second electrode" may be a drain electrode. Alternatively, the "first electrode" may be a drain electrode and the "second electrode" may be the source electrode.

The process and principle of the pixel circuit provided in the present embodiment that drives a light emitting device in an OLED pixel to emit light will be described in detail with an example in which the first transistor M1, the second transistor M2, the third transistor M3, and the driving transistor DTFT are all P-type transistors, in conjunction with the timings of the various input signals in this case.

Figure 3:
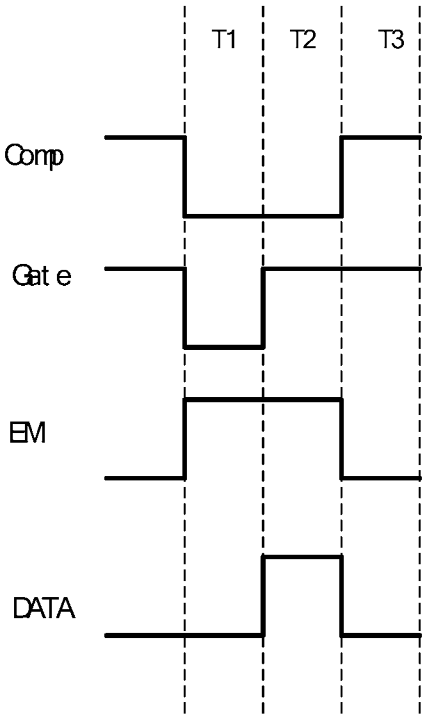
FIG. 3 is a timing diagram showing various input signals of the pixel circuit in a period of driving a light emitting device to emit light according to an embodiment of the present disclosure.
Figure 4:
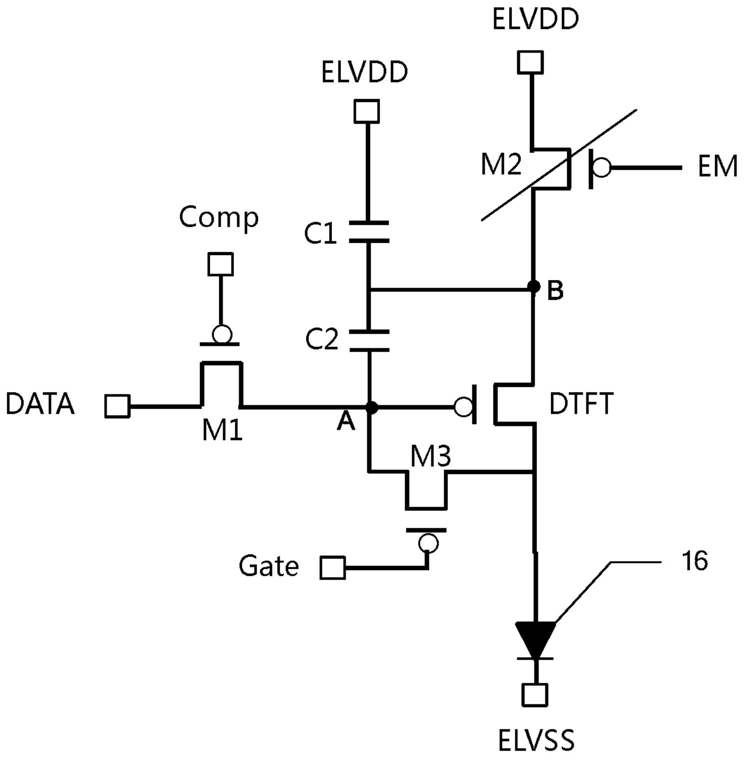
FIG. 4 is a schematic diagram showing an equivalent circuit of the pixel circuit in an initialization stage according to an embodiment of the present disclosure.

Referring to FIG. 3, FIG. 3 is a timing diagram showing various input signals in a period of driving a light emitting device to emit light. In an initialization stage, i.e., the stage T1 in the timing diagram, low level signals are inputted to the first scan signal input terminal Comp and the second scan signal input terminal Gate, the first transistor M1 is turned on, and the third transistor M3 is turned on. The data signal input terminal DATA inputs an initial data voltage Vint of low level to the control electrode of the driving transistor DTFT, the conduction between the control electrode and the second electrode of the driving transistor DTFT is established, so that the second electrode of the driving transistor DTFT, i.e., the anode of the light emitting device 16 has the same voltage as the control electrode of the driving transistor DTFT. At that point, Vint may be set to be less than the cathode voltage ELVSS of the light emitting device 16 to ensure that the light emitting device does not emit light during this stage. In this stage, a high level signal is inputted to the light emitting signal input terminal EM, thereby the second transistor M2 is turned off, the driving transistor DTFT establishes the conduction between its first electrode and second electrode according to the voltages of its control electrode, first electrode and its threshold voltage. At the same time, the voltage of the first electrode of the driving transistor DTFT begins to decrease from a first voltage V1 in the light emitting stage of a previous period, until the voltage of the first electrode drops down to Vint−Vth, the driving transistor DTFT is turned off and the first electrode of the driving transistor DTFT is disconnected from its second electrode. Vth is the threshold voltage of the driving transistor DTFT. FIG. 4 is a schematic diagram showing an equivalent circuit of the pixel circuit in the initialization stage.

Figure 5:
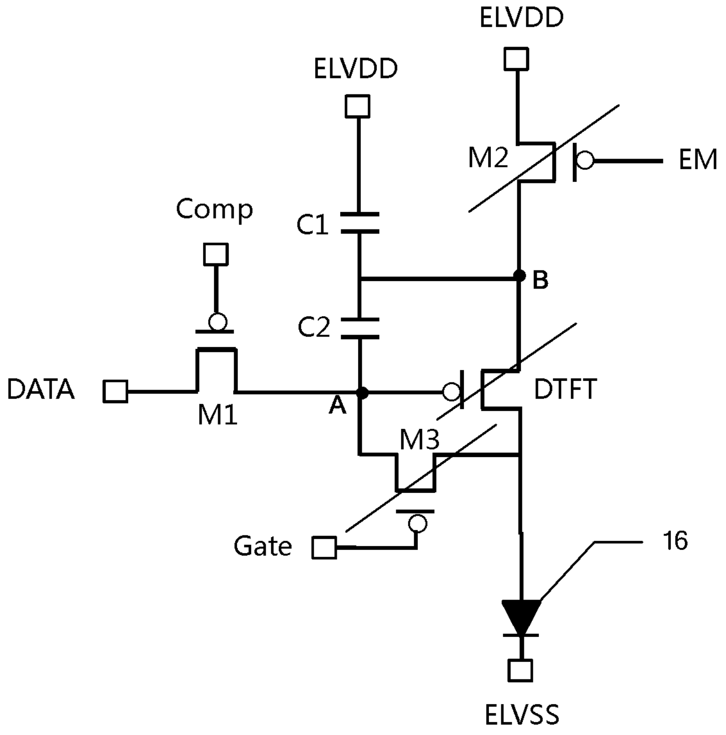
FIG. 5 is a schematic diagram showing an equivalent circuit of the pixel circuit in a data writing stage according to an embodiment of the present disclosure.

In the data writing stage, i.e., the stage T2 in the timing diagram, high level signals are inputted to the second scan signal input terminal Gate and the light emitting signal input terminal EM, and the second transistor M2 and the third transistor M3 are turned off. A low level signal is inputted to the first scan signal input terminal Comp, the first transistor M1 is turned on, and a working data voltage Vdate is inputted to the control electrode of the driving transistor DTFT from the data signal input terminal DATA. Due to the coupling effect of the first capacitor C1 and the second capacitor C2, the voltage of the first electrode of the driving transistor DTFT is $Vint-Vth+C2/(C2+C1)*(Vdata-Vint)$. In this stage, the driving transistor DTFT is turned off, and the data writing process is completed. Vdata may be at a high level or a low level, so long as it is ensured that the driving transistor DTFT is turned off during the data writing stage. The specific value of Vdata is not limited in the present disclosure. FIG. 5 is a schematic diagram showing an equivalent circuit of the pixel circuit in the data writing stage.

Figure 6:
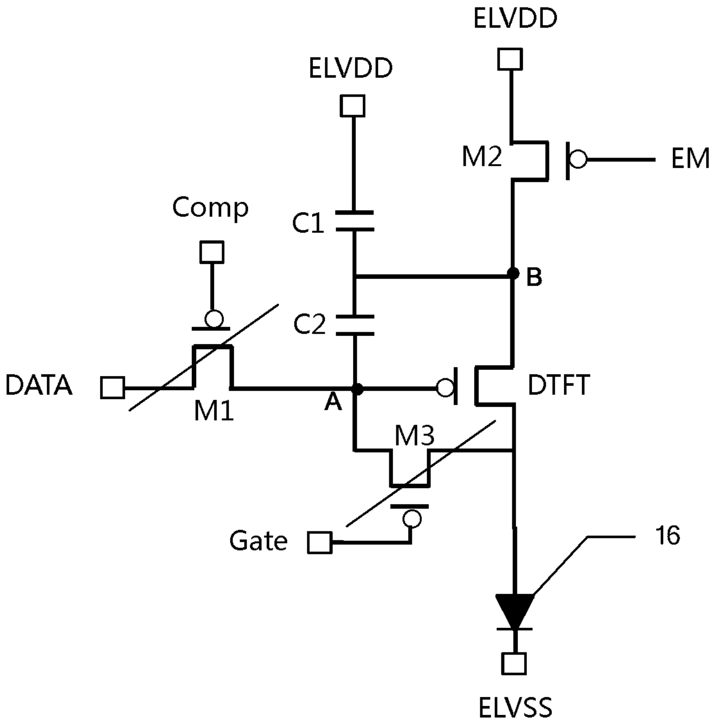
FIG. 6 is a schematic diagram showing an equivalent circuit of the pixel circuit in a light emitting stage according to an embodiment of the present disclosure.

In the light emitting stage, i.e., the stage T3 in the timing diagram, high level signals are inputted to the first scan signal input terminal Comp and the second scan signal input terminal Gate, and the first transistor M1 and the third transistor M3 are turned off. A low level signal is inputted to the light emitting signal input terminal EM, and the second transistor M2 is turned on. A voltage V is inputted to the first electrode of the driving transistor DTFT from the common voltage input terminal ELVDD (the first terminal of the first capacitor C1 and the first electrode of the second transistor M2 are both electrically connected to the common voltage input terminal ELVDD in the embodiment, and the corresponding input voltage is V). Due to the bootstrap effect of the second capacitor C2, the voltage of the control electrode of the driving transistor DTFT is Vdata+(V−(Vint−Vth+C2/(C2+C1)*(Vdata−Vint))). At this point, the driving transistor generates a driving current according to the voltages of its control electrode and first electrode, as well as the threshold voltage of the driving transistor DTFT, to drive the light emitting device to emit light. FIG. 6 is a schematic diagram showing an equivalent circuit of the pixel circuit in the light emitting stage. The driving current can be expressed by the following formula:

$$I_{OLED} = \frac{\beta}{2}\left(Vdata - V\text{int} - \frac{C2}{C2 + C1} \times (Vdata - V\text{int})\right)^2$$

It can be known from the above formula that the driving current for driving the light emitting device 16 to emit light is independent of the threshold voltage of the driving transistor DTFT, so that image unevenness caused by threshold voltage drift can be eliminated, and the brightness of the light emitting device 16 may remain stable. On the other hand, the driving current is independent of the voltage inputted from the first voltage input terminal ELVDD1 or the second voltage input terminal ELVDD2 or the common voltage input terminal ELVDD, so that the problem of uneven pixel illumination caused by IR Drop can be eliminated, and the uniformity of pixel brightness may be further improved. Further, the pixel circuit provided in this embodiment is a 4T2C (i.e., 4 TFTs and 2 capacitors) structure, and the number of TFTs is reduced by about 3 compared with the number of TFTs in the pixel circuit or the driving circuit in the prior art, which is advantageous for a high PPI pixel design, and may improve the aperture ratio of display pixels with an unchanged number of GOA (Gate On Array) elements, thereby is suitable for products with a high PPI and narrow bezel design.

Figure 7:
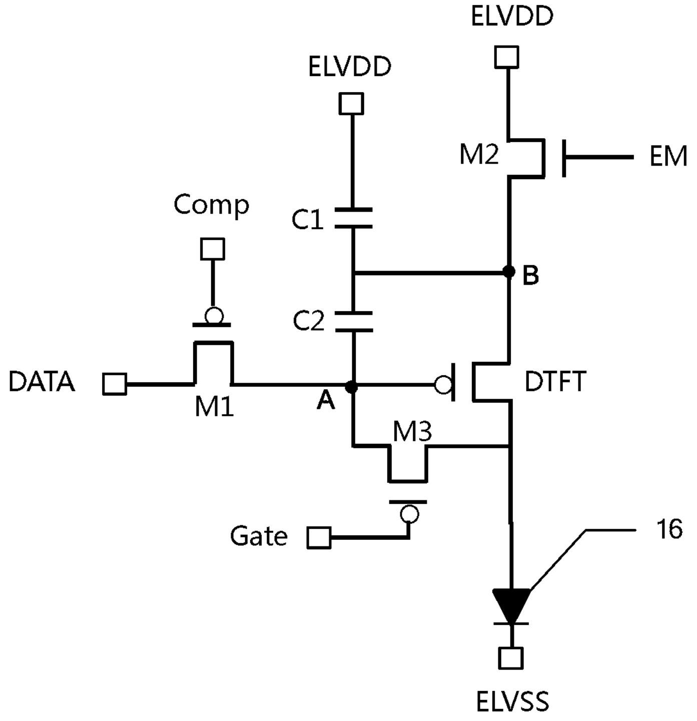
FIG. 7 is a schematic structural diagram of another pixel circuit according to an embodiment of the present disclosure.
Figure 8:
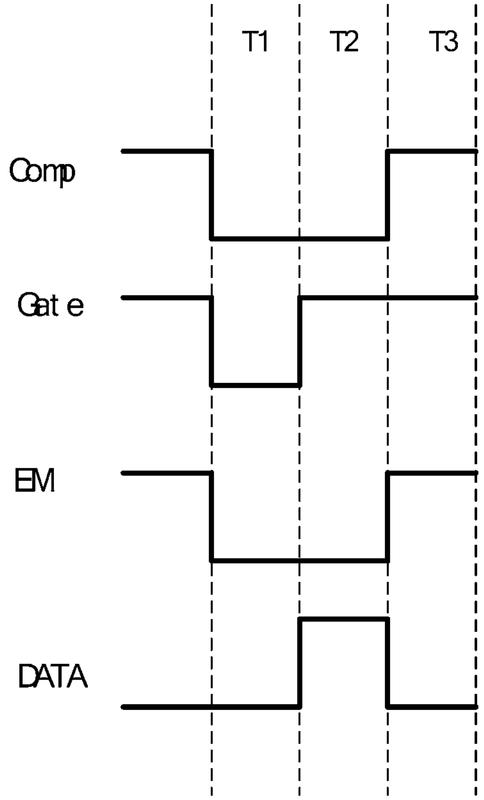
FIG. 8 is a timing diagram showing various input signals of the another pixel circuit in a period of driving a light emitting device to emit light according to an embodiment of the present disclosure.

In another embodiment of the present disclosure, as shown in FIG. 7, a schematic diagram of a pixel circuit is provided, in which the second transistor M2 is an N-type transistor and the other transistors are P-type transistors. FIG. 8 shows a timing diagram of input signals for driving the light emitting device to emit light correspondingly. For the operation states of this pixel circuit in the initialization stage, the data writing stage, and the light emitting stage, reference can be made to the previous embodiments, which will not be repeated herein.

It should be noted that, in the present disclosure, the transistors are not limited to P-type transistors. In practical applications, the transistors may also be N-type transistors. It can be understood that, in the case where the transistors are N-type transistors, correspondingly, the various signals may have opposite phases to those shown in FIG. 3. In practical applications, when the first transistor and the second transistor are of opposite types, that is, when the first transistor M1 is a P-type transistor and the second transistor is an N-type transistor, or when the first transistor M1 is an N-type transistor and the second transistor M2 is a P-type transistor, the first scan signal input terminal Comp may share a same signal line with the light emitting signal input terminal EM, so that the number of signal lines can be further reduced and the aperture ratio can be improved.

This embodiment provides a pixel circuit for driving a light emitting device in an OLED pixel to emit light. The pixel circuit includes a data writing circuit, a light emitting control circuit, a threshold compensation circuit, a first storage circuit, a second storage circuit, a driving circuit and a light emitting device. With this pixel circuit, the driving circuit may generate a driving current that is independent of its threshold voltage in the light emitting stage, thereby compensating for image unevenness caused by threshold voltage drift.

Figure 9:
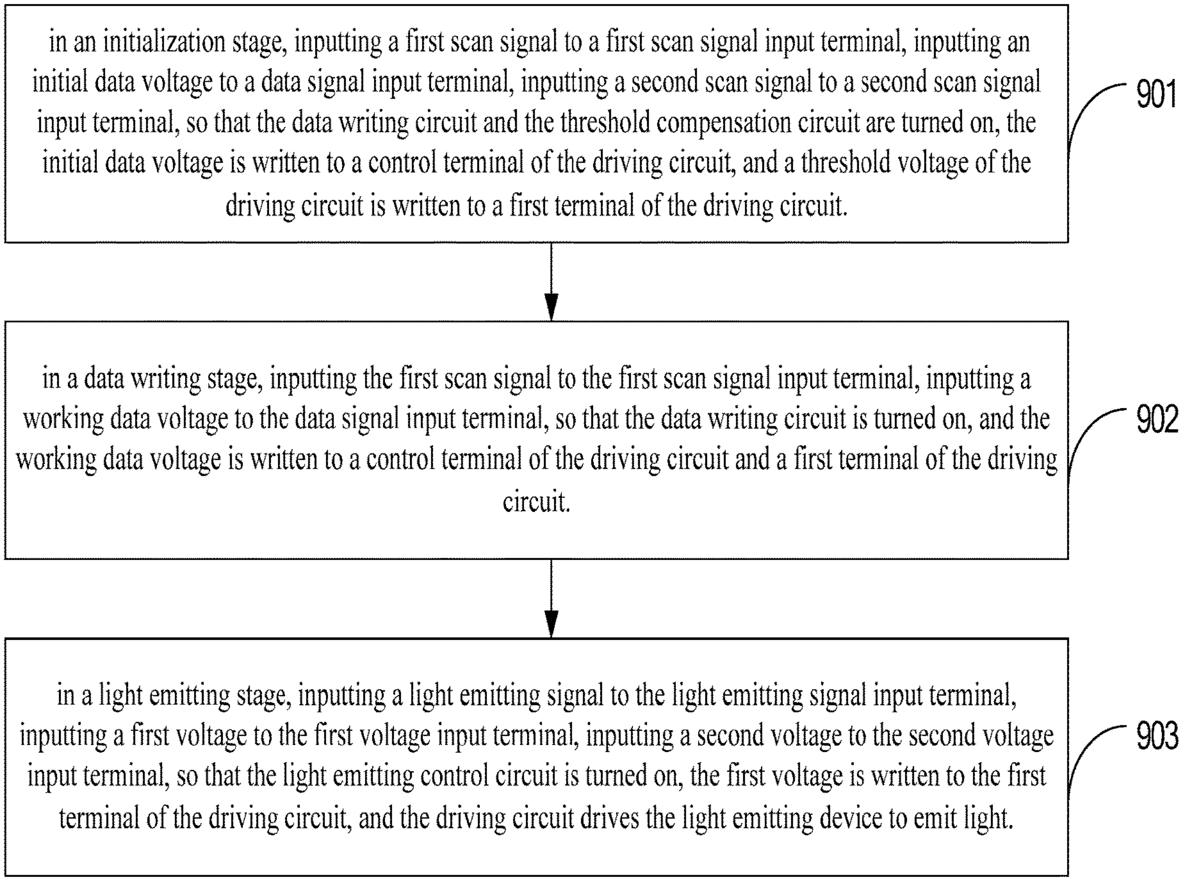
FIG. 9 is a flow chart showing the steps of a method of driving a pixel circuit according to an embodiment of the present disclosure.

In another embodiment of the present disclosure, a method of driving the pixel circuit is provided, which is applied to the pixel circuit of any one of the previous embodiments. Referring to FIG. 9, the method may include following steps.

step 901: in an initialization stage, a first scan signal is inputted to a first scan signal input terminal, an initial data voltage is inputted to a data signal input terminal, a second scan signal is inputted to a second scan signal input terminal, so that the data writing circuit and the threshold compensation circuit are turned on, the initial data voltage is written to a control terminal of the driving circuit, and a threshold voltage of the driving circuit is written to a first terminal of the driving circuit.

step 902: in a data writing stage, the first scan signal is inputted to the first scan signal input terminal, a working data voltage is inputted to the data signal input terminal, so that the data writing circuit is turned on, and the working data voltage is written to a control terminal of the driving circuit and a first terminal of the driving circuit.

step 903: in a light emitting stage, a light emitting signal is inputted to the light emitting signal input terminal, a first voltage is inputted to the first voltage input terminal, a second voltage is inputted to the second voltage input terminal, so that the light emitting control circuit is turned on, the first voltage is written to the first terminal of the driving circuit, and the driving circuit drives the light emitting device to emit light.

In an implementation of this embodiment, in the case where the data writing circuit includes a first transistor, the light emitting control circuit includes a second transistor, the threshold compensation circuit includes a third transistor, and the driving circuit includes the driving transistor, and if the first transistor, the second transistor, the third transistor and the driving transistor are all P-type transistors, the method may further include following steps.

In the initialization stage, a low level signal is inputted to the first scan signal input terminal, a low level signal is inputted to the second scan signal input terminal, a high level signal is inputted to the light emitting signal input terminal, and an initial data voltage is inputted to the data signal input terminal. The initial data voltage may be a low level signal.

In the data writing stage, a low level signal is inputted to the first scan signal input terminal, a high level signal is inputted to the second scan signal input terminal, a high level signal is inputted to the light emitting signal input terminal, and a working data voltage is inputted to the data signal input terminal. The working data voltage may be a high level signal.

In the light emitting stage, a high level signal is inputted to the first scan signal input terminal, a high level signal is inputted to the second scan signal input terminal, and a low level signal is inputted to the light emitting signal input terminal.

In another implementation of this embodiment, in the case where the data writing circuit includes a first transistor, the light emitting control circuit includes a second transistor, the threshold compensation circuit includes a third transistor, and the driving circuit includes the driving transistor, and if the first transistor, the third transistor, and the driving transistor are all P-type transistors and the second transistor is a N-type transistor, the method may further include following steps.

In the initialization stage, a low level signal is inputted to the first scan signal input terminal, a low level signal is inputted to the second scan signal input terminal, a low level signal is inputted to the light emitting signal input terminal, and an initial data voltage is inputted to the data signal input terminal. The initial data voltage may be a low level signal.

In the data writing stage, a low level signal is inputted to the first scan signal input terminal, a high level signal is inputted to the second scan signal input terminal, a low level signal is inputted to the light emitting signal input terminal, and a working data voltage is inputted to the data signal input terminal. The working data voltage may be a high level signal.

In the light emitting stage, a high level signal is inputted to the first scan signal input terminal, a high level signal is inputted to the second scan signal input terminal, and a high level signal is inputted to the light emitting signal input terminal.

Specifically, for the operation process and principle of the method of driving a pixel circuit as provided in this embodiment, reference can be made to the previous embodiments, which will not be described in detail herein.

In order to further reduce the number of signal lines and improve the aperture ratio, in the above method, the first voltage input terminal may share a same signal line with the second voltage input terminal.

When the second electrode of the driving transistor is connected to the anode of the light emitting device, in order to ensure that the light emitting device does not emit light during the initialization stage, in the above driving method, the initial data voltage inputted to the data signal input terminal may be less than the cathode voltage of the light emitting device.

In another embodiment of the present disclosure, there is also provided a display device including the pixel circuit of any one of the above embodiments.

Embodiments of the present disclosure provide a pixel circuit, a method of driving the pixel circuit, and a display device. The pixel circuit is configured to drive a light emitting device in an OLED pixel to emit light, including a data writing circuit, a light emitting control circuit, a threshold compensation circuit, a first storage circuit, a second storage circuit, a driving circuit, and a light emitting device. With this pixel circuit, the driving transistor may generate a driving current that is independent of its threshold voltage in the light emitting stage, thereby compensating for image unevenness caused by threshold voltage drift. Furthermore, the driving current is independent of the voltages inputted from the first voltage input terminal or the second voltage input terminal, so that the problem of uneven pixel illumination caused by IR Drop can be eliminated, and the uniformity of pixel brightness may be further improved. Moreover, the pixel circuit provided in this embodiment is a 4T2C structure, and the number of TFTs is reduced comparing with the number of TFTs in the pixel circuit or driving circuit in the prior art, which is advantageous for a high PPI pixel design, and may improve the aperture ratio of display pixels.

Each embodiment in this description is described in a progressive manner and focuses on differences from other embodiments. For the same or similar parts of the various embodiment, reference can be made to each other.

Note that, in this description, the use of relational terms, if any, such as first and second and the like are used solely to distinguish one from another entity or action without necessarily requiring or implying any actual such relationship or order between such entities or actions. Further, terms “include”, “comprise” or their any other variations are intended to encompass non-exclusive composition, so that a process, method, product or device comprising a series of factors may comprise not only these factors, but also other factors that are not listed explicitly, or factors intrinsic to this process, method, product or device. Without limitation, a factor defined by wording “comprise one . . . ” does not exclude the existence of other same factors in a process, method, product or device comprising such factor.

A pixel circuit, a driving method thereof, and a display device provided in the present disclosure have been described in detail above. Specific examples are applied in this text to elaborate the principles and embodiments of the present disclosure, and the aforementioned descriptions of the embodiments are only used to help understanding the method of the present disclosure as well as its core thoughts. For those of ordinary skill in the art, according to the concept of the present disclosure, variations can be made to the embodiments and application scope of the present disclosure. To sum up, the contents of the present disclosure cannot be understood as limitations to the present disclosure.

What is claimed is:

1. A pixel circuit, including:

a light emitting device;

a driving circuit, electrically connected to the light emitting device, and configured to drive the light emitting device to emit light;

a data writing circuit, electrically connected to a first scan signal input terminal, a data signal input terminal and a control terminal of the driving circuit respectively, and configured to, according to a first scan signal inputted from the first scan signal input terminal, control the data signal input terminal to input a data voltage to the control terminal of the driving circuit;

a light emitting control circuit, electrically connected to a light emitting signal input terminal, a first voltage input terminal and a first terminal of the driving circuit respectively, and configured to, according to a light emitting signal inputted from the light emitting signal input terminal, control the first voltage input terminal to input a first voltage to the first terminal of the driving circuit;

a threshold compensation circuit, electrically connected to a second scan signal input terminal, the control terminal of the driving circuit and a second terminal of the driving circuit, and configured to, according to a second scan signal inputted from the second scan signal input terminal, control a conduction or disconnection between the control terminal of the driving circuit and the second terminal of the driving circuit, wherein the second terminal of the driving circuit is directly connected to an anode of the light emitting device;

a first storage circuit, electrically connected to a second voltage input terminal and the first terminal of the driving circuit respectively, and configured to store a voltage difference between a second voltage of the second voltage input terminal and the first terminal of the driving circuit; and a second storage circuit, electrically connected to the first terminal of the driving circuit and the control terminal of the driving circuit respectively, and configured to store a voltage difference between the first terminal of the driving circuit and the control terminal of the driving circuit, wherein in an initialization stage, the data voltage is provided through the data writing circuit and the threshold compensation circuit to the anode of the light emitting device and is less than a cathode voltage of the light emitting device.

2. The pixel circuit according to claim 1, wherein the data writing circuit includes a first transistor, a control electrode of the first transistor is electrically connected to the first scan signal input terminal, a first electrode of the first transistor is electrically connected to the data signal input terminal, and a second electrode of the first transistor is electrically connected to the control terminal of the driving circuit.

3. The pixel circuit according to claim 2, wherein the light emitting control circuit includes a second transistor, a control electrode of the second transistor is electrically connected to the light emitting signal input terminal, a first electrode of the second transistor is electrically connected to the first voltage input terminal, and a second electrode of the second transistor is electrically connected to the first terminal of the driving circuit.

4. The pixel circuit according to claim 3, wherein the first transistor and the second transistor are of opposite types, the first scan signal input terminal shares a first signal line with the light emitting signal input terminal.

5. The pixel circuit according to claim 1, wherein the threshold compensation circuit includes a third transistor, a control electrode of the third transistor is electrically connected to the second scan signal input terminal, a first electrode of the third transistor is electrically connected to the control terminal of the driving circuit, and a second electrode of the third transistor is electrically connected to the second terminal of the driving circuit.

6. The pixel circuit according to claim 1, wherein the first storage circuit includes a first capacitor, a first terminal of the first capacitor is electrically connected to the second voltage input terminal, and a second terminal of the first capacitor is electrically connected to the first terminal of the driving circuit.

7. The pixel circuit according to claim 1, wherein the second storage circuit includes a second capacitor, a first terminal of the second capacitor is electrically connected to the first terminal of the driving circuit, and a second terminal of the second capacitor is electrically connected to the control terminal of the driving circuit.

8. The pixel circuit according to claim 1, wherein the driving circuit includes a driving transistor, a control electrode of the driving transistor is electrically connected to the data writing circuit, the second storage circuit and the threshold compensation circuit respectively, a first electrode of the driving transistor is electrically connected to the light emitting control circuit, the first storage circuit and the second storage circuit respectively, and a second electrode of the driving transistor is electrically connected to the threshold compensation circuit and the light emitting device respectively.

9. The pixel circuit according to claim 1, wherein the first voltage input terminal shares a second signal line with the second voltage input terminal.

10. A display device including the pixel circuit of claim 1.

11. A method of driving the pixel circuit of claim 1, including:

in an initialization stage, inputting a first scan signal to the first scan signal input terminal to turn on the data writing circuit, inputting a second scan signal to the second scan signal input terminal to turn on the threshold compensation circuit, and inputting an initial data voltage to the data signal input terminal, such that the initial data voltage is written to the control terminal of the driving circuit, and a threshold voltage of the driving circuit is written to the first terminal of the driving circuit;

in a data writing stage, inputting the first scan signal to the first scan signal input terminal to turn on the data writing circuit, and inputting a working data voltage to the data signal input terminal, such that the working data voltage is written to the control terminal of the driving circuit and the first terminal of the driving circuit; and in a light emitting stage, inputting a light emitting signal to the light emitting signal input terminal to turn on the light emitting control circuit, inputting a first voltage to the first voltage input terminal, such that the first voltage is written to the first terminal of the driving circuit, and inputting a second voltage to the second voltage input terminal, such that the driving circuit drives the light emitting device to emit light.

12. The method according to claim 11, wherein the data writing circuit includes a first transistor, the light emitting control circuit includes a second transistor, the threshold compensation circuit includes a third transistor, the driving circuit includes a driving transistor, and the first transistor, the second transistor, the third transistor and the driving transistor are all P-type transistors, in the initialization stage, the first scan signal is a low level signal, the second scan signal is a low level signal, and the light emitting signal is a high level signal;

in the data writing stage, the first scan signal is a low level signal, the second scan signal is a high level signal, and the light emitting signal is a high level signal; and in the light emitting stage, the first scan signal is a high level signal, the second scan signal is a high level signal, and the light emitting signal is a low level signal.

13. The method according to claim 11, wherein the data writing circuit includes a first transistor, the light emitting control circuit includes a second transistor, the threshold compensation circuit includes a third transistor, the driving circuit includes a driving transistor, the first transistor, the third transistor and the driving transistor are all P-type transistors, and the second transistor is a N-type transistor, in the initialization stage, the first scan signal is a low level signal, the second scan signal is a low level signal, and the light emitting signal is a low level signal;

in the data writing stage, the first scan signal is a low level signal, the second scan signal is a high level signal, and the light emitting signal is a low level signal; and in the light emitting stage, the first scan signal is a high level signal, the second scan signal is a high level signal, and the light emitting signal is a high level signal.

14. The method according to claim 11, wherein the data writing circuit includes a first transistor, the light emitting control circuit includes a second transistor, the first transistor and the second transistor are of opposite types, and the first scan signal is identical with the light emitting signal.

15. The method according to claim 11, wherein the data writing circuit includes a first transistor, the light emitting control circuit includes a second transistor, the threshold compensation circuit includes a third transistor, the driving circuit includes a driving transistor, and the first voltage is identical with the second voltage.

* * * * *